United States Patent [19]

Goff

[11] Patent Number: 5,575,932
[45] Date of Patent: Nov. 19, 1996

[54] METHOD OF MAKING DENSELY-PACKED ELECTRICAL CONDUCTORS

[75] Inventor: Jerry K. Goff, Doylestown, Pa.

[73] Assignee: Performance Controls, Inc., Horsham, Pa.

[21] Appl. No.: 242,335

[22] Filed: May 13, 1994

[51] Int. Cl.⁶ .................................................. B23K 26/12
[52] U.S. Cl. ............................... 219/121.84; 219/121.85; 364/474.08; 427/555; 427/116; 29/598
[58] Field of Search ......................... 219/121.69, 121.72, 219/121.84, 121.85, 121.2, 121.41; 427/554–556, 596, 597, 116; 29/596, 598, 602.1, 847, 609; 216/13, 17, 37, 65, 94; 364/474.08; 156/643.1

[56] References Cited

U.S. PATENT DOCUMENTS

| | | | |
|---|---|---|---|
| 3,461,347 | 8/1969 | Lemelson | 427/109 |
| 3,801,366 | 4/1974 | Lemelson | 427/597 |
| 4,333,900 | 6/1982 | Carey . | |
| 4,477,324 | 10/1984 | Cline . | |
| 4,547,961 | 10/1985 | Bokil et al. . | |
| 4,639,832 | 1/1987 | Behn . | |
| 4,653,178 | 3/1987 | Graul . | |
| 4,674,179 | 6/1987 | Gugel et al. . | |
| 4,695,419 | 9/1987 | Inariba . | |
| 4,711,026 | 12/1987 | Swiggett et al. . | |
| 4,729,510 | 3/1988 | Landis | 29/825 |
| 4,771,362 | 9/1988 | Behn . | |
| 4,904,527 | 2/1990 | Nolle et al. . | |
| 4,912,832 | 4/1990 | Egger et al. . | |
| 5,017,753 | 5/1991 | Deckard | 219/121.84 |
| 5,047,386 | 9/1991 | Hed . | |
| 5,056,214 | 10/1991 | Holt . | |
| 5,091,286 | 2/1992 | Person | 216/65 |
| 5,175,922 | 1/1993 | Gugel et al. . | |
| 5,191,701 | 3/1993 | Espenhaim . | |
| 5,349,743 | 9/1994 | Grader et al. | 29/602.1 |

Primary Examiner—Teresa J. Walberg
Assistant Examiner—Gregory L. Mills
Attorney, Agent, or Firm—William H. Eilberg

[57] ABSTRACT

Windings for an electric motor are formed by depositing successive layers of conductive material and etching into the conductive material with a precisely-controlled high-energy beam. A computer stores information on the exact structure of the monolith of windings to be built, in the form of a series of successive planar cross-sections of the monolith. In making the monolith, one deposits a layer of conductive material onto a workpiece, bonds the conductive material to the workpiece, and cuts a pattern into the layer, using a high-energy beam in the presence of an oxidizing atmosphere. The beam causes the formation of electrically-insulating oxides which separate the layer into distinct conductive regions, according to a pattern defined by one of the stored cross-sections. In an alternative, one can also inject additional insulating material into the cuts formed by the beam. The monolith is thus built up, layer by layer, in a series of iterations. No actual wire is ever used, and the result is a monolith having conductors equivalent to windings which occupy a large percentage of the available cross-sectional area.

3 Claims, 4 Drawing Sheets

METHOD OF MAKING DENSELY-PACKED ELECTRICAL CONDUCTORS

BACKGROUND OF THE INVENTION

This invention relates to the field of the manufacture of motors and other electrical devices requiring densely-packed windings.

An electric motor works by the magnetic attraction or repulsion between a moving part (the rotor) and a fixed part (the stator). The required magnetic attraction or repulsion is produced by electromagnets formed by winding wire around a core through slots. To maximize the magnetic field available, and therefore the force of attraction or repulsion exerted by the electromagnet, one must maximize the number of turns of wire, or the conductor cross-section, so as to maximize the current that can be put through the wire. But for a given available space, the number of turns of wire, and the size of the wire, that can be wound around the core is limited.

Maximizing the conductor cross-section means minimizing the cross-sectional area occupied by the insulation on the wire, and minimizing the unused space between wires. In the ideal case, the windings are so densely packed that the space between wires, and the space taken by the insulation, are negligible. In this ideal case, the efficiency of the motor is maximized because, for a given motor size, the diameter of the conductors forming the windings can be increased, thereby substantially reducing resistive losses, which are proportional to the square of the current. But in practice, it is difficult even to approach the goal of the ideal case. For a given cross-sectional area available for winding a coil, one can generally fill only 40%, economically, of the cross-sectional area with actual conductors. The insulation on the wire, and around the slot, and the small but finite voids between usually round wires, occupy the balance of the cross-section.

The present invention provides a method of making a monolith comprising a plurality of windings, wherein the windings are packed with high density. The windings formed according to the present invention occupy a substantially greater percentage of the cross-sectional area than do windings formed in the conventional manner. Thus, the present invention greatly increases the efficiency of an electric motor. With the present invention, for example, one can, without increasing the size of the motor, increase the diameter of the conductors forming the windings, or one can reduce the total cross-sectional area of the conductors and use the saved space to provide more iron in the structure, thereby increasing its magnetic saturation. Further, the inherent temperature limitation of wire insulating material, which must withstand the flexing of the winding operation, is overcome by manufacturing refractory material in place, as a solid monolith, thereby greatly increasing the capacity of the product to withstand high temperatures.

SUMMARY OF THE INVENTION

The process of the present invention comprises a method of building a monolith that comprises a plurality of electric motor windings, or other configuration of electrical conductors. The present invention does not start with actual wires; instead, the monolith is built up in small increments, layer by layer.

To practice the present invention, one must first provide a computer having a memory which stores representations of a series of planar cross-sections of the monolith to be constructed. Each cross-section shows the presence or absence of a conductor at each location of the plane. Successive cross-sections are taken along mutually parallel planes, and each cross-section has a small but finite thickness. The desired final product comprises the combination of all such cross-sections, tightly packed together.

To start the construction of the monolith, one begins with a foundation or substrate which could be metal or ceramic, or other rigid material. If the foundation is electrically conductive, it is first necessary to provide a layer of insulation over all or part of it, to isolate the foundation electrically from the windings to be built up. If the foundation is made of a metal whose oxide is electrically insulating, the insulation can be created by directing a relatively wide laser beam (or its equivalent), in the presence of an oxygen atmosphere, towards those portions of the foundation which are to be insulated. The heat of the laser beam, and the presence of oxygen, cause the selected portions to oxidize, so as to form the electrically insulating oxide (such as aluminum oxide). This insulating step can be performed selectively, only at locations corresponding to conductors on the first stored cross-section, or it can be performed across the entire area of the foundation.

When one has the insulating foundation, one can begin the iterative process of building conductors. For each iteration, a computer refers to a cross-section stored in memory. A layer of aluminum is deposited onto the workpiece, such as by thermal spraying of aluminum powder, followed by ultrasonic compression, or by a process of laser cladding/surfacing, and the aluminum is made to adhere tightly to the workpiece, so as to form a surface of solid aluminum. Next, a narrow-beam laser is directed towards the aluminum surface, in the presence of oxygen, so as to make a pattern of cuts in that surface, according to the pattern defined by the edges of the conductive regions indicated in the stored cross-section. The heat from the laser and the oxygen cause the aluminum to oxidize in the immediate vicinity of the cuts, and the result is a plurality of contiguous conductive regions which are electrically insulated from each other. The iterative process is then repeated, using the next stored cross-section. Each iteration adds a thin layer to the monolith.

If the oxide produced by the laser cutting is insufficient to create the necessary insulating barrier between the conductive regions, one can apply additional insulating material, at the time of the laser cutting step, directly to the area of the cut. Such material could be a slurry of aluminum oxide. The latter alternative could also be used where copper is used instead of aluminum, since copper oxides are not electrically insulating.

Thus, in the present invention, no conventional wire is ever used; instead, the conductors are built up in situ, so they are already very densely packed as soon as they are formed. The conductors are electrically separated by the oxide formed when the laser makes the desired cuts, and/or by the added insulation applied when making the cuts, and there are no empty spaces between conductors.

The invention is not limited to the fabrication of motor windings, but can be used in any application requiring a large number of densely-packed electrical conductors. For example, the invention can be used to make transformers, inductors, and capacitors.

The present invention therefore has the primary object of providing a method of making motor windings having a large number of densely-packed electrical conductors.

The invention has the further object of providing a method for making a monolith which includes densely-packed electrical conductors.

The invention has the further object of increasing the efficiency of an electric motor, by increasing the utilization of the space available for holding the motor windings.

The invention has the further object of providing a method for making densely-packed wires, wherein the method eliminates the need to manipulate conventional wire.

The invention has the further object of providing a method and apparatus for automatically making a monolith of densely-packed conductors under computer control.

The invention has the further object of making a monolith of dense- ly-packed electrical conductors which can withstand elevated temperatures.

The invention has the further object of reducing the weight of a set of densely-packed electrical conductors.

The reader skilled in the art will recognize other objects and advantages of the invention, from a reading of the following brief description of the drawings, the detailed description of the invention, and the appended claims.

DETAILED DESCRIPTION OF THE INVENTION

In this specification, the term "winding" is sometimes used to designate the conductors built up by the process of the invention. The term is used for convenience of description only; as will be apparent from the following explanation, the present invention does not have actual windings, in the conventional sense of the word. The conductors of the present invention are not wires which are "wound".

Figure 1:
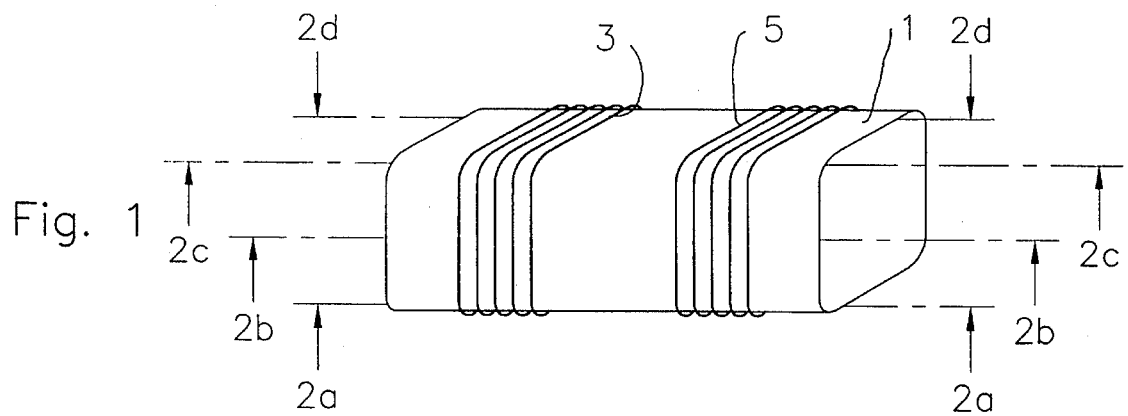
FIG. 1 provides a perspective view of a hypothetical pair of windings formed around a core.

FIG. 1 illustrates a hypothetical monolith to be constructed according to the present invention. The monolith comprises electrically insulating core 1 upon which are wound two coils 3 and 5, each coil having five turns. The coils are separated by a space which has no winding. The monolith shown in FIG. 1 is highly simplified, for purposes of illustration.

FIGS. 2a through 2d show cross-sections of the monolith of FIG. 1, taken along various planes, as indicated in FIG. 1. Each plane is perpendicular to the paper. In effect, one can consider the monolith to be composed of a set of discrete planar sheets, the sheets being properly aligned and firmly pressed together. The cross-sections shown in Figures 2a through 2d represent some of the cross-sections which together illustrate the major features of the monolith.

In the example shown in FIG. 1, the core 1 is not cylindrical, but instead is flattened at its top, bottom, and sides, and curved at the corners. For purposes of clarity of illustration, the thicknesses of the various regions illustrated in FIGS. 2a through 2d are exaggerated, and the positions of these regions are not drawn to the same scale as in Figure 1.

Each cross-section taken through the monolith may contain regions corresponding to a wire and regions corresponding to the absence of a wire. In the example of FIGS. 1 and 2a–2d, each cross-section will include regions corresponding to a wire, but in the most general case, a given cross-section may contain any number (including zero) regions corresponding to a wire.

Figure 2A:
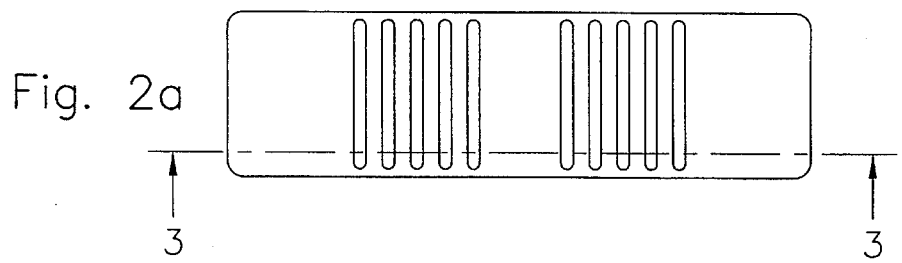
FIGS. 2a through 2d show idealized cross-sectional views, taken along the lines indicated in FIG. 1, each cross-section being taken along a plane perpendicular to the paper in FIG. 1.

In FIG. 2a, the cross-section is taken through the bottom of the monolith, and includes ten elongated, contiguous regions corresponding to the bottom edge of the monolith. The ten elongated regions represent the paths traced by the wires along the bottom of the monolith.

Figure 2B:
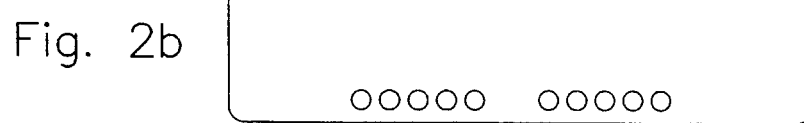

In FIG. 2b, the cross-section has been taken at a location displaced from the bottom edge of the monolith. This cross-section intercepts the windings at twenty locations, so FIG. 2b shows twenty contiguous regions corresponding to the intersection of the windings with the plane of the cross-section.

Figure 2C:
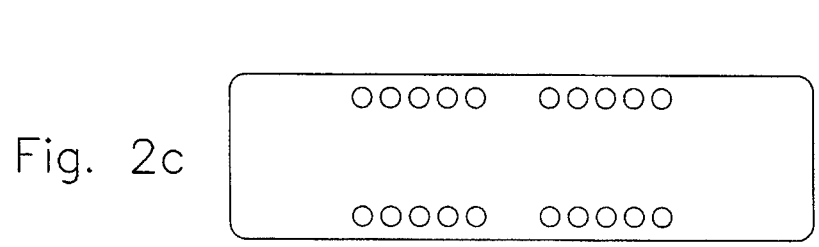

In FIG. 2c, the cross-section has been taken at a location farther up along the monolith. Since the walls of the monolith are flat except near the corners, the resulting cross-section appears the same as in FIG. 2b.

Figure 2D:
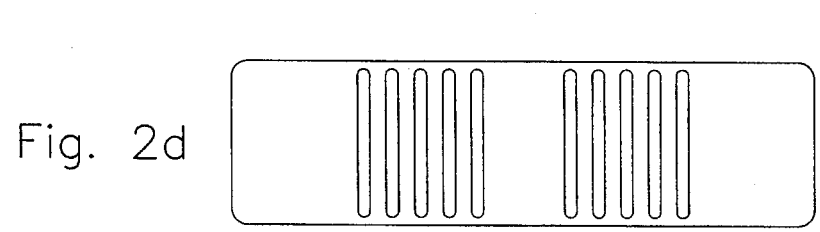

FIG. 2d is identical to FIG. 2a, and represents the cross-section taken at the top of the monolith. But in general, one can practice the invention with a monolith of arbitrary shape, and it is not necessary to make the monolith symmetrical about any axis.

It is central to the operation of the present invention that an arbitrary monolith can be represented as the combination of a plurality of cross-sections, the cross-sections being taken along successive mutually parallel planes. It is also essential that the patterns generated by taking such cross-sections be stored by automated means, such as in the memory of a computer, so that the process of fabricating the monolith can be performed in a reasonably short time. The memory of the computer is therefore programmed with a solid model of the monolith to be constructed. The representation of the monolith in this manner is analogous to the representation of the human brain in computerized axial tomography (CAT), and the technology for representing and storing information about the monolith, in this manner, is within the level of ordinary skill in the art.

FIGS. 3a through 3e illustrate the major steps of the method of the present invention. These figures represent a substrate, and the building of layers onto the substrate, to form the monolith. FIGS. 3a–3e continue the example of FIGS. 1 and 2a–2d. Each of FIGS. 3a–3e is taken in a direction indicated by the line 3—3 of FIG. 2a. Thus, these figures are front elevational views of the substrate as it is being built up.

The first step in the method of the present invention is to provide a substrate which serves as a foundation for the monolith to be constructed. The substrate is shown as element 10 in FIG. 3a. The substrate can be any rigid material. For example, it could be a metal (such as aluminum), or it could be ceramic. One benefit of a metallic substrate is that it tends to conduct excess heat away from the structure. The disadvantage of metal is that it must be electrically isolated from the conductors forming the windings, because the substrate is not intended to be connected electrically to any of the conductors forming the windings.

Figure 3A:
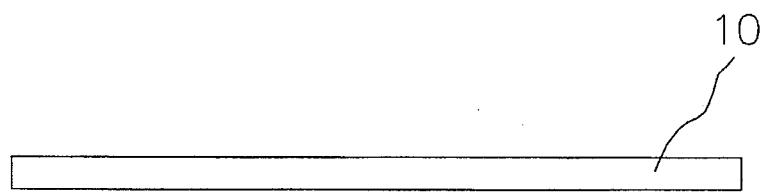
FIGS. 3a through 3e show front elevational views of a substrate upon which a monolith is built according to the present invention, the figures showing the major steps in the process, and corresponding to the example shown in FIG. 1.
Figure 3B:
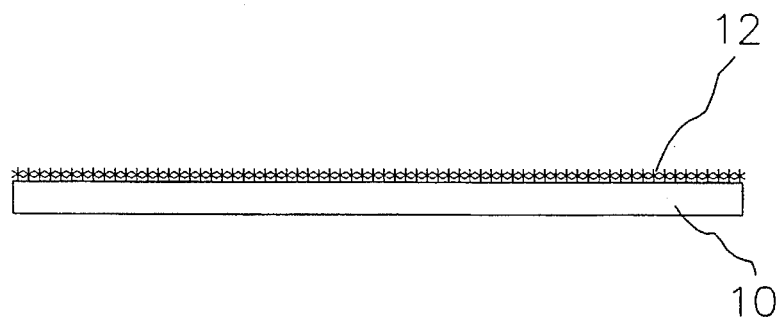

If the substrate is electrically conductive, it is necessary to insulate the substrate, either in whole or in part, so as to isolate the substrate from the conductors to be built up. One way of insulating an aluminum substrate is to direct a laser beam towards the substrate, in the presence of an oxygen atmosphere. The heat produced by the laser causes the aluminum to react with the oxygen to form a layer of aluminum oxide (alumina), which is electrically insulating. FIG. 3b shows the substrate with layer 12 of alumina. The coating of alumina could be provided over the entire surface of the substrate, or it could be applied only to those portions of the substrate that are in the immediate vicinity of the conductors to be formed. The coating of alumina is very thin, generally of the order of about 10–30 mils (0.010–0.030 inches). The thickness of the coating is exaggerated in the figures, for purposes of illustration.

If the substrate is made of a metal whose oxide is not a good insulator, then some other technique of insulation would be used. If the substrate is made of an electrically insulating material, such as ceramic, the above-described preparatory step can be omitted.

Figure 3C:
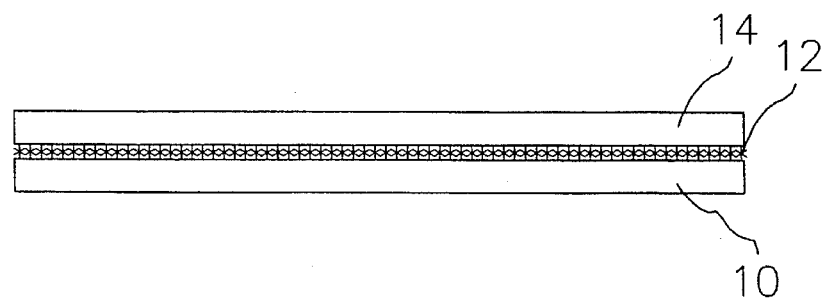

After one has provided the necessary insulating substrate, the iterative process of the present invention can begin. One first applies a layer 14 of metal, over the layer of alumina (or over the insulating substrate, if applicable), as shown in FIG. 3c. In the case of a ceramic substrate, the layer 12 of alumina would be omitted, and the metallic layer would be applied directly on the substrate.

The layer 14 may be applied, for example, by various processes which are known in the prior art. One such process is the thermal spraying of aluminum powder onto the substrate. The layer 14 is then bonded to the previous layer through any combination of mechanical pressure, ultrasonic energy, and heat. One could alternatively use the technique of laser cladding or surfacing to apply the metallic layer. In either case, the layer 14 becomes welded to the previous layer. The term "surfacing" refers to the case in which a material is applied to a previous layer made of the same material. The term "cladding" refers to the case in which a material is applied to a previous layer made of a different material.

Figure 3D:
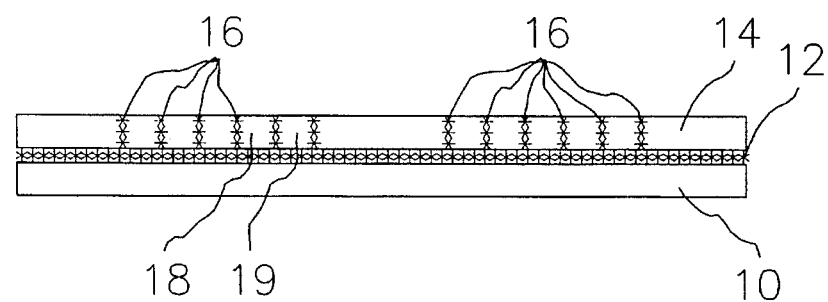

Next, one uses a narrow-beam laser, or its equivalent, to cut the layer 14 in selected locations, so as to duplicate the patterns shown in a stored cross-section of the monolith, as shown in FIG. 3d. In the example shown, the laser makes cuts indicated by reference numeral 16, so as to create the pattern represented in FIG. 2a. If the layer 14 is aluminum, the cutting operation is performed in the presence of oxygen, so that the heat generated at each cut causes aluminum oxide (alumina), an electrical insulator, to form along the cut. The result is a plurality of contiguous regions of the aluminum layer 14, each region being separated from each other by an electrically insulating boundary. Thus, for example, adjacent portions 18 and 19 are separated by an electrically insulating "wall" defined by the alumina formed by the cutting action of the laser.

Keyhole processing techniques, known in the prior art, can be used in making the cuts in the present invention, as they allow highly efficient formation of welds or cuts in highly conductive material.

Figure 3E:
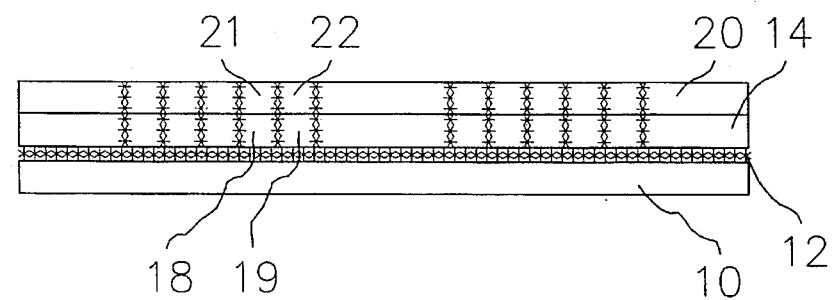

FIG. 3e represents the repetition of some of the previous steps to produce the next layer of the monolith. In particular, a new layer 20 of aluminum is welded onto the previous layer of the monolith. Then, the new layer 20 is etched by the laser, in the presence of oxygen, so as to produce the desired electrical separation of regions of that layer. Note, however, that portion 18 is electrically connected to portion 21, and portion 19 is electrically connected to portion 22. Thus, portions 18 and 21 form the beginning of a series of pieces of conductive material which eventually will form the equivalent of a wire. The same is true for the other corresponding portions of the layers. These built-up wires are kept electrically separate from each other, due to the formation of electrically insulating alumina at the locations of cutting by the laser.

Note that, due to the direction in which the views of FIGS. 3a–3e are taken, the latter figures do not give information about how far the conductors would extend in a direction perpendicular to the paper. However, the latter information is apparent by reference to FIGS. 1 and 2a–2d.

The procedure represented by FIG. 3e is repeated. Each iteration of the process corresponds to the next cross-section defining the monolith. The pattern of cuts is made with the narrow-beam laser in a manner which substantially duplicates the pattern in the stored cross-section being implemented. In the example shown in the figures, the pattern of cuts formed on the substrate will be identical to the patterns shown in FIGS. 2a–2d, for the corresponding planar sections. In general, the pattern of cuts can be relatively simple or very complex, as dictated by the current stored cross-section. For each iteration, the computer retrieves the next stored cross-section and uses that cross-section to guide the laser in making the cuts.

In FIG. 3e, it is apparent that one builds the wire forming each winding piece by piece, in a direction longitudinally of the wire. However, it should be understood that the particular pattern of conductive regions in each cross-section depends upon the location and orientation of the plane along which the cross-section is taken, and upon the configuration of the desired final product. Thus, in general, one could build the "wires" of the monolith in any direction, as long as the conductors are properly insulated from each other, and as long as there is continuity between conductive regions of adjacent layers where necessary. This specification uses the term "wires" to describe the conductors in the finished monolith, because the conductors formed by the process are electrically and magnetically indistinguishable from conventional wires, but it is understood that no actual wire, in the conventional sense, is ever used in building the monolith.

Figure 4:
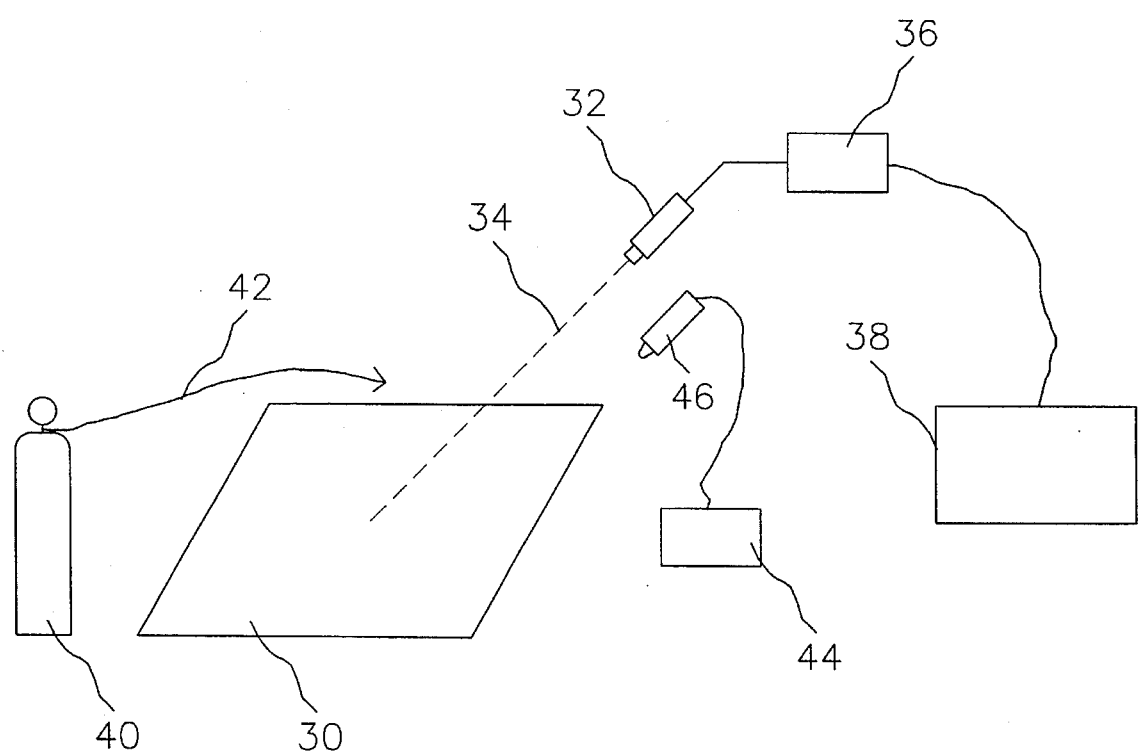
FIG. 4 provides a schematic diagram of the major components used to practice the method of the present invention.

FIG. 4 shows a schematic diagram of the major components of an apparatus used to practice the invention. Foundation (or substrate) 30 is shown as a flat sheet. The foundation comprises the workpiece in the present process. Laser 32 is operated by positioning motor 36 to direct laser beam 34 towards the desired location on the workpiece. Computer 38 controls the operation of the motor. The motor must be capable of pre- cisely guiding the laser beam to form the desired patterns. The computer includes a memory which stores the information defining the series of cross-sections forming the desired monolith. The computer also includes software which determines the movements of the motor, according to the pattern to be cut into the layer of conductive material. In controlling the laser, it is necessary not only to move the laser, but also to actuate and de-actuate the laser as necessary to form the required pattern of cuts. Oxygen tank 40 supplies oxygen for the process, through conduit 42, which is directed to the vicinity of the workpiece.

The individual components, taken alone, as shown in FIG. 4, are commercially available, and do not form part of the present invention.

The preferred material for the conductor is aluminum. However, the invention is not limited to aluminum, but can be practiced with other materials that will form electrically insulating oxides when sufficient heat is applied.

It is also possible to use metals, such as copper, whose oxides are not good electrical insulators. In this case, it is necessary to provide additional insulating material when the cuts are made with the laser. FIG. 4 shows source 44 of insulating material which is directed to a nozzle 46. The nozzle can be controlled by the positioning motor 36, or by another motor which is also controlled by computer 38, so that the nozzle follows the laser and injects the insulating material directly and immediately into the area being cut.

Source 44 may contain a slurry of aluminum oxide, another oxide, or some other insulating material such as a diamond film. While the material from source 44 is intended especially for use in cases where one uses a metal whose oxide is not electrically insulating, the material could be used even when the conductive material is aluminum. The insulating mate- rial would bolster the insulating character of the walls separating the conductive regions.

The invention is also not limited to the use of a laser. Other means of accomplishing the cutting of the aluminum layer, such as a high-energy electron or ion beam, or even mechanical scribing, could also be used.

In one example, aluminum is used as the conductive material, and the "wires" formed by the process of the present invention may have a major cross-sectional dimension of about 0.10 inches, while the thickness of the alumina between adjacent wires is of the order of 10 mils (0.010 inches). If the cross-section of each conductor is square, having a side of 0.10 inches, and the layer of alumina attributable to the wire is about 0.005 inches thick (i.e. one-half of the thickness of the alumina wall), the conductor will account for approximately 83% of the total cross-sectional area of the wires. Thus, in the numerical example given above, the present invention almost doubles the amount of wire which one can pack into an available space. The numbers given above are only one example of the present invention, and are not intended to limit the invention to any particular parameters.

The savings achieved by the present invention can be used in one or more of several ways. First, it is possible to reduce the overall size of a motor, while still providing windings having the same number of turns, the conductors of the windings having the same thickness. Secondly, one can maintain the size of the motor while increasing the diameter of each conductor in the windings, thereby reducing the resistive losses in the windings, as compared with the conventional structure. Thirdly, one can maintain the size of the motor while reducing the space occupied by the windings, while maintaining the thickness of the conductors of the windings. In the latter case, the extra space made available can be used to provide additional iron, which increases the magnetic saturation of the structure. The present invention can also be used to reduce the weight of a winding, because of the reduction in the relative amount of insulation, the reduction in overall size, and possible substitution of aluminum for copper. One can "spend" the savings achieved by the present invention in any of the above ways, or in various combinations of the above ways.

The present invention also has the advantage that it increases the thermal capacity of the winding. The enamel that coats conventional wires is flexible but melts at relatively low temperatures. If the enamel melts, the turns of the windings can become short-circuited. Thus, it is necessary to cool the windings, adding to the expense of operation. In the present invention, a metal oxide forms the insulating barrier between conductors, and this oxide will not melt until temperatures exceeding the copper or aluminum melting temperatures are reached. Thus, the windings made by the present invention can be used without cooling, or with a lesser amount of cooling than is required in conventional circuitry.

In the example shown in FIGS. 1, 2a–2d, and 3a–3e, there is a relatively large space between the coils 3 and 5. In FIGS. 3a–3e, this space is filled with aluminum, although this aluminum is not electrically connected to any of the conductors defining the windings. Alternatively, one could form oxide in these spaces to provide further electrical insulation. One could also refrain from spraying aluminum in those regions where no conductors are needed. One could provide an insulating material in these regions, instead of spraying aluminum. That insulating material could be applied gradually, as the layers are built up, or insulating spacers could be laid down as the monolith is being built. All such alternatives are within the scope of the invention.

Figure 5:
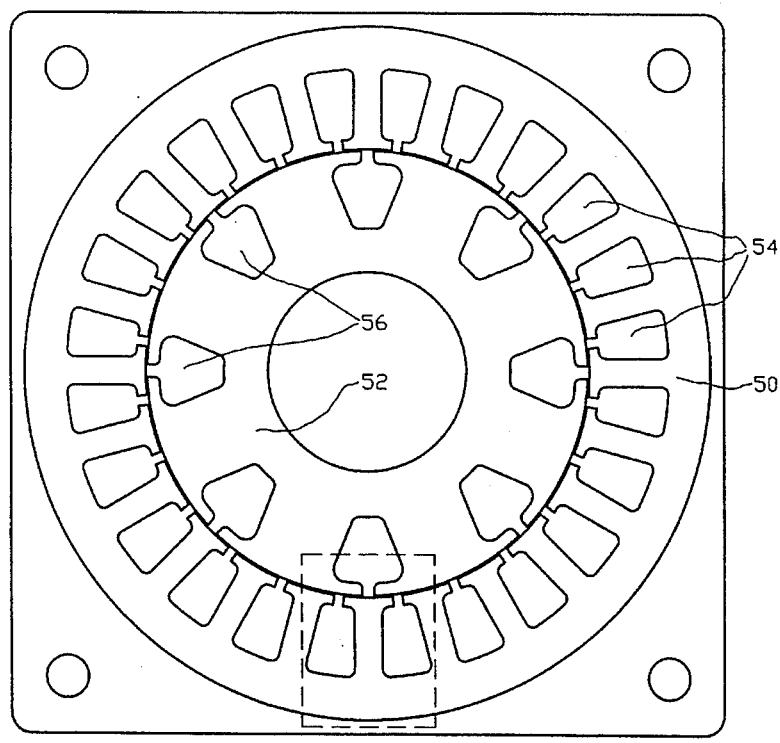
FIG. 5 shows a plan view of a core forming the rotor and stator of an electric motor, onto which one can wind conventional windings.
Figure 6:
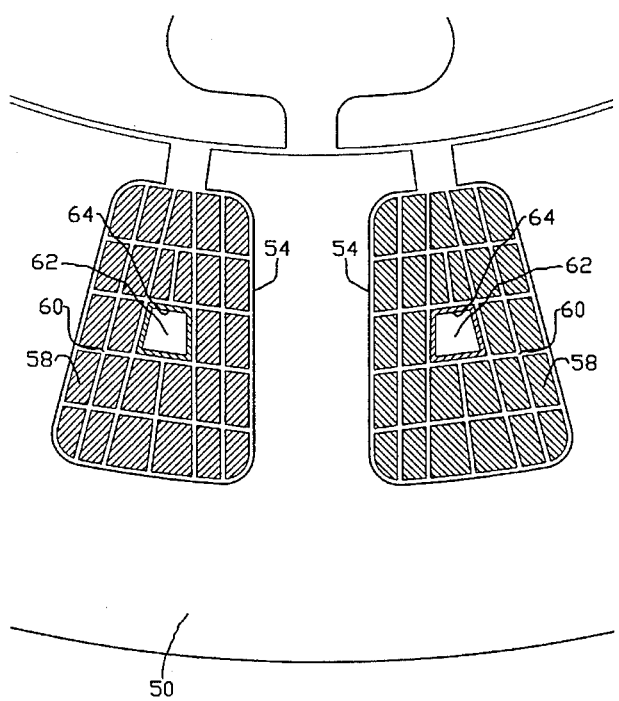
FIG. 6 is a detailed view corresponding to the box indicated by the dotted lines in FIG. 5, the present figure showing a cross-section of conductors formed according to the present invention.

FIGS. 5 and 6 together show an example of the context in which the present invention can be used. FIG. 5 shows a core used to build windings in the conventional manner. Reference numeral 50 indicates the stator and reference numeral 52 indicates the rotor. Slots 54 provide surfaces onto which one winds the stator windings, and slots 56 provide surfaces for winding the rotor windings.

In the present invention, the same core could be used, but no actual windings of wire are made. Instead, the entire monolith, including the core and the conductors, is built up one layer at a time, as described above. FIG. 6 represents a detail taken from the dotted box of Figure 5. In FIG. 6, the conductors have been constructed according to the present invention. The longitudinal axes of the conductors are generally perpendicular to the paper, in the area where the cross-section has been taken.

In FIG. 6, the slots 54 are substantially filled with distinct conductors 58, the conductors being separated from each other by insulating regions 60. Note that the conductors have varying cross-sectional shapes, and that they fill the great majority of the cross-sectional area of the slot.

FIG. 6 also illustrates another feature of the invention, namely the provision of a cooling conduit. FIG. 6 shows empty spaces 62, which are used as conduits to allow water, or other coolant, to be circulated through the stator. The spaces 62 may be lined with metal layer 64, which could be the same or different from the metal used to form conductors 58. The metal layer 64 could also be omitted.

While a cooling conduit could be provided in a conventional motor winding, such a conduit represents an obstruction when the windings are formed, and makes it even more difficult to fill the available space with conductors. With the present invention, however, it is very easy to circumnavigate such obstructions, since the conductors are not physically wound, but instead are built up in thin layers.

Although the invention has been described with respect to certain specific embodiments, many variations are possible. As indicated above, the invention is not necessarily limited to the use of aluminum, and is not limited to any particular means of generating a high-energy beam. The arrangement of hardware components used to practice the invention can be changed. The software used to generate and store the cross-sections of the monolith, and to control the movements of the laser, or equivalent device, can also assume many forms, within the scope of the invention.

The exact cross-sectional shape of each conductor formed by the present invention can be varied. The conductors could have circular, polygonal, or irregular cross-sections, the cross-sectional shape being determined by the computer which guides the movements of the laser. Moreover, the cross-sectional shape of a particular conductor can change as one proceeds longitudinally along the conductor. That is, a given conductor could be circular in one position and square in another. This feature makes it easier to form the conductors around obstructions. These and other modifications should be considered within the spirit and scope of the following claims.

What is claimed is:

1. A method of making a monolith of densely-packed electric conductors, the method comprising the steps of:
   a) selecting an arbitrary monolith to be built, the monolith being selected from the group consisting of all structures having at least one electrical winding,
   b) storing information corresponding to a series of successive planar cross-sections of said monolith, wherein all of said successive planar cross-sections together define said monolith in its entirety, at least some of said cross-sections comprising a pattern of conductive and non-conductive regions,
   c) depositing a layer of electrically conductive material on a workpiece,
   d) cutting a pattern into said layer using a high-energy beam, in the presence of an oxidizing atmosphere, the cutting step being performed so as to duplicate substantially, on said layer, the pattern obtained from one of said cross-sections, and
   e) repeating steps (c) and (d) in a series of iterations, wherein each iteration corresponds to one of said cross-sections, the iterations being performed in the same order in which the cross-sections are stored, wherein the monolith comprises a core forming a rotor and stator of an electric motor, and a plurality of windings formed on the rotor and stator.

2. The method of claim 1, wherein the storing step is performed by a programmed computer, the computer having a memory which stores a solid model of the monolith, and which stores cross-sections of the solid model.

3. The method of claim 2, wherein the iterations are preceded by the preparatory step of forming an electrically insulating barrier on at least part of a substrate, the substrate comprising the initial workpiece, the barrier forming step being performed only once.

* * * * *